United States Patent [19]
Allen

[11] Patent Number: 5,904,504
[45] Date of Patent: May 18, 1999

[54] DIE ATTACH METHOD AND INTEGRATED CIRCUIT DEVICE

[75] Inventor: Howard Allen, Limington, Me.

[73] Assignee: Fairchild Semiconductor Corp., South Portland, Me.

[21] Appl. No.: 09/025,911

[22] Filed: Feb. 19, 1998

[51] Int. Cl.[6] .......................... H01L 21/44; H01L 21/48; H01L 21/50
[52] U.S. Cl. ......................... 438/123; 438/106; 438/121
[58] Field of Search .................................... 438/123, 121, 438/106

[56] References Cited

U.S. PATENT DOCUMENTS

| | | | |
|---|---|---|---|
| 4,346,124 | 8/1982 | Wood et al. | 427/82 |
| 5,151,386 | 9/1992 | Bottari et al. | 437/187 |
| 5,200,362 | 4/1993 | Lin et al. | 438/126 |
| 5,226,361 | 7/1993 | Grant et al. | 101/44 |
| 5,286,679 | 2/1994 | Farnworth et al. | 437/209 |
| 5,384,286 | 1/1995 | Hirai | 438/124 |
| 5,423,889 | 6/1995 | Colquitt et al. | 29/25.01 |
| 5,647,122 | 7/1997 | Launay et al. | 29/840 |
| 5,739,053 | 4/1998 | Kawakita et al. | 438/125 |

*Primary Examiner*—Kevin M. Picardat
*Assistant Examiner*—D. Mark Collins
*Attorney, Agent, or Firm*—Pierce Atwood; Celia H. Leber, Esq.; Chris A. Caseiro, Esq.

[57] ABSTRACT

Die attach methods are provided. These methods include (a) providing a supply of die attach adhesive, (b) applying a portion of the die attach adhesive to a transfer member, and (c) contacting the lead frame paddle with the transfer member to print a layer of adhesive onto the lead frame paddle. Integrated circuit (IC) devices are also provided.

12 Claims, 4 Drawing Sheets

DIE ATTACH METHOD AND INTEGRATED CIRCUIT DEVICE

BACKGROUND OF THE INVENTION

The present invention relates to die attach methods and integrated circuit (IC) devices.

During the manufacture of IC devices, a plurality of IC chips, also known as a "die", are bonded to the paddles of a lead frame. A die 10, bonded to a paddle 12 of lead frame 14 is shown schematically in FIG. 1. This step is commonly referred to as "die attach". Following die attach, electrical connections are established between each die 10 and the fingers 16 of the lead frame with wires 18 by a wire bonding process. Finally, each die is enclosed in an individual package and the packages are separated to form individual IC devices.

The die is typically bonded to the lead frame using an electrically conductive, e.g., silver filled, die attach adhesive. Generally, dots of the die attach adhesive are applied to the lead frame paddle by a pneumatically energized syringe. Die attach adhesives applied in this manner generally include significant amounts of volatile solvent to reduce their viscosity sufficiently to allow the adhesive to be pumped through the syringe. It is also generally necessary that the solvent have a low evaporation rate, to provide a long working time to prevent the adhesive from drying out during the die attach process.

Several disadvantages tend to result from applying the die attach adhesive by syringe. First, it is often difficult to control both the amount of adhesive dispensed and the bond line thickness (thickness of adhesive under the die). If too much of the adhesive is applied, adhesive may run up the sides of the die, potentially causing short circuiting and/or wire bonding problems. If too little adhesive is applied, the bond line thickness may be insufficient, resulting in poor bond strength. Second, the solvents used to reduce the adhesive viscosity and provide working time may outgas, resulting in actual or perceived reliability problems. Finally, air may be trapped under the die, creating voids which can weaken the bond strength and interfere with heat transfer between the die and the lead frame paddle.

SUMMARY OF THE INVENTION

The present invention provides die attach methods that allow the amount of adhesive dispensed to be readily controlled, resulting in a predetermined uniform bond line thickness, minimizing waste of die attach adhesive, and preventing excessive spread of die attach adhesive up the sides of the die. In preferred methods, the die attach adhesive contains high evaporation rate solvents that are selected to reduce solvent outgassing after the die attach material has been cured.

In one aspect, the invention features a method of applying a die attach adhesive to a lead frame feature, e.g., a paddle, including, (a) providing a supply of die attach adhesive, (b) applying a portion of the die attach adhesive to a transfer member, and (c) contacting the lead frame feature with the transfer member to print a layer of adhesive onto the lead frame feature.

Preferred methods include one or more of the following features. The supply of adhesive is provided in a reservoir. The portion of die attach adhesive is applied to the transfer member by pressing the transfer member against a surface of a template, the template having a recess in its surface that contains a predetermined quantity of die attach adhesive. The dimensions of the recess are substantially equal to the dimensions of the lead frame feature. The method further includes transferring adhesive from the reservoir to the recess in the template. The transfer member includes a compressible pad. The compressible pad is compressed during step (c). The die attach adhesive is B-stageable. The method further includes B-staging the adhesive after step (c). The method further includes repeating steps (b) and (c) until a desired adhesive thickness is obtained on the lead frame paddle.

In another aspect, the invention features an IC device having an advantageously small amount of adhesive extending up its sidewalls. The IC device includes a lead frame having a lead frame feature constructed to receive a die, e.g., a lead frame paddle, and a die having a top surface, bottom surface and sidewalls extending between the top and bottom surfaces. The die is bonded to the lead frame feature by a die attach adhesive, and a fillet of die attach adhesive extends up the sidewalls from the bottom surface a distance of less than 5 mils. Preferably, there is substantially no fillet of adhesive.

In yet another aspect, the invention features an IC device having an advantageously uniform, continuous bondline. The IC device includes a lead frame having a lead frame feature constructed to receive a die, e.g., a lead frame paddle, and a die having a top surface, bottom surface and sidewalls extending between the top and bottom surfaces. The bottom surface of the die is bonded to the lead frame feature by a die attach adhesive, and the adhesive forms a layer that is substantially continuous over the bottom surface and that is substantially uniform in thickness over its area.

Other features and advantages of the invention will be apparent from the following detailed description, the drawings, and the claims.

BRIEF DESCRIPTION OF THE DRAWINGS

FIGS. 2a–2G are schematic side views showing the system performing the steps of the die attach method.

DETAILED DESCRIPTION OF PREFERRED EMBODIMENTS

Figure 1:
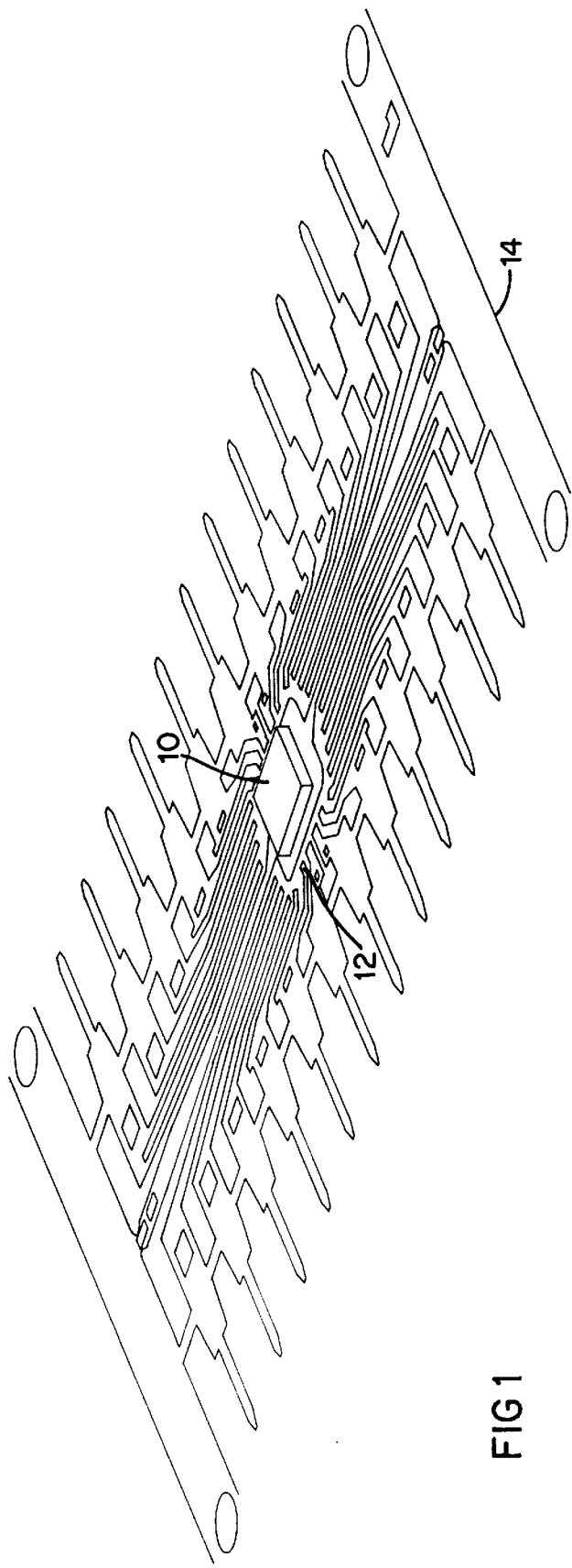
FIG. 1 is a perspective view of a die attached to a lead frame.
Figure 2:
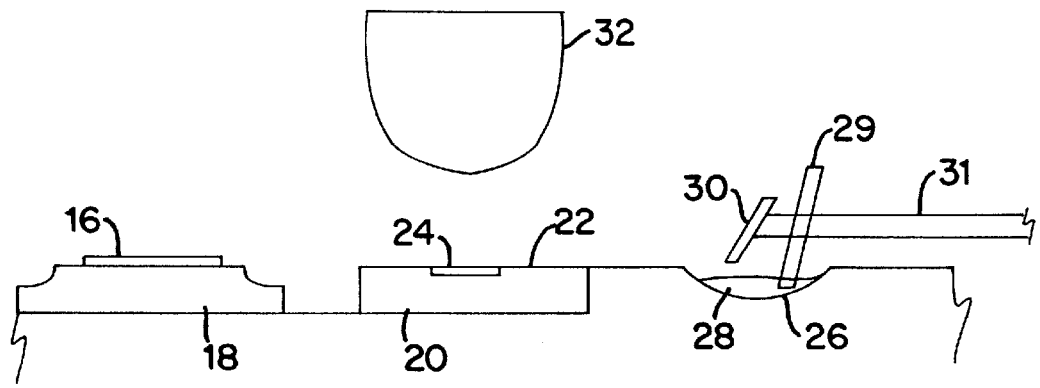
FIGS. 2, 2a–2g is a schematic side view of a system for performing a die attach method according to one embodiment of the invention.
Figure 2A:
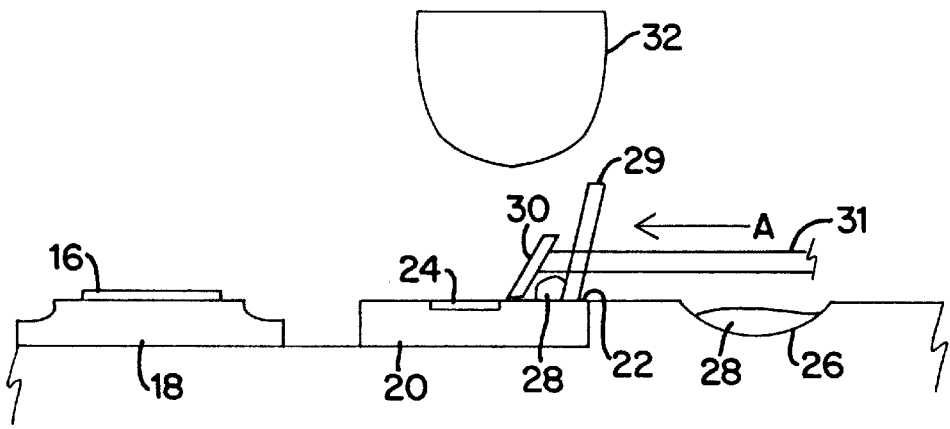
Figure 2B:
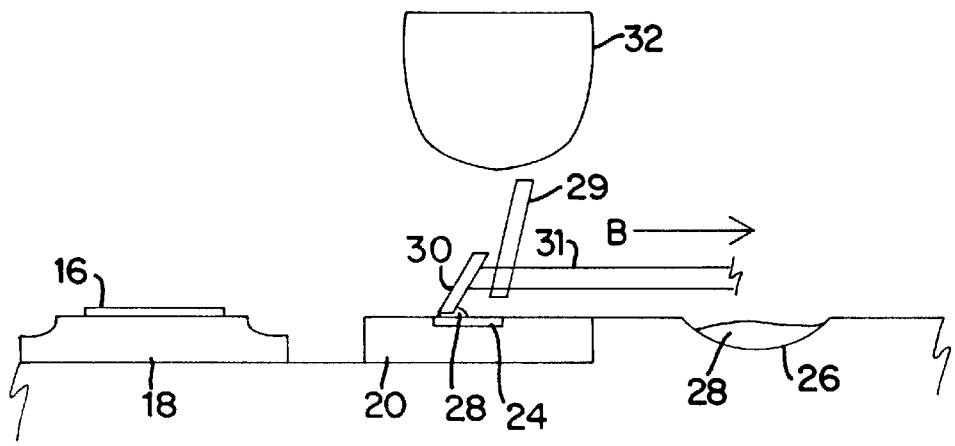
Figure 2C:
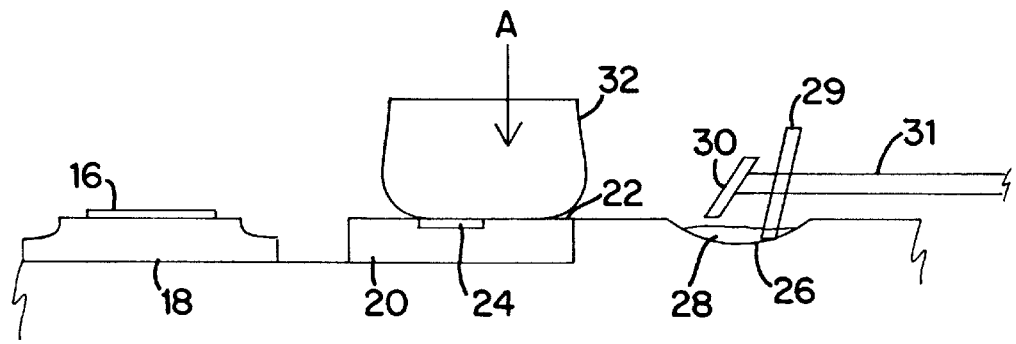
Figure 2D:
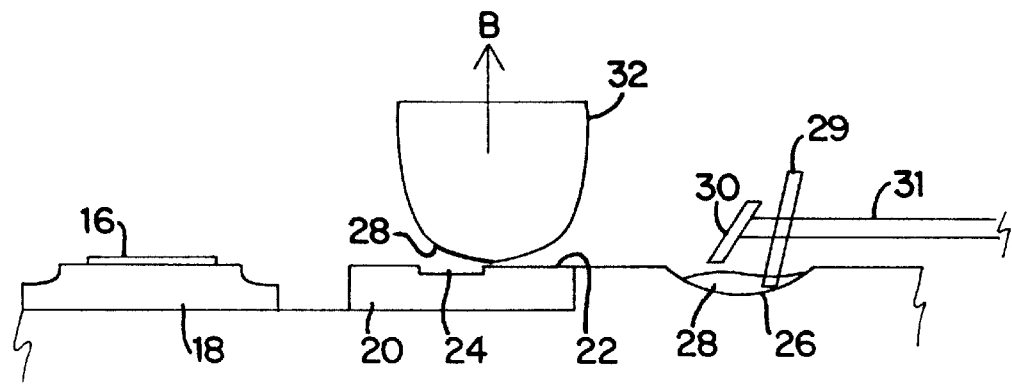
Figure 2E:
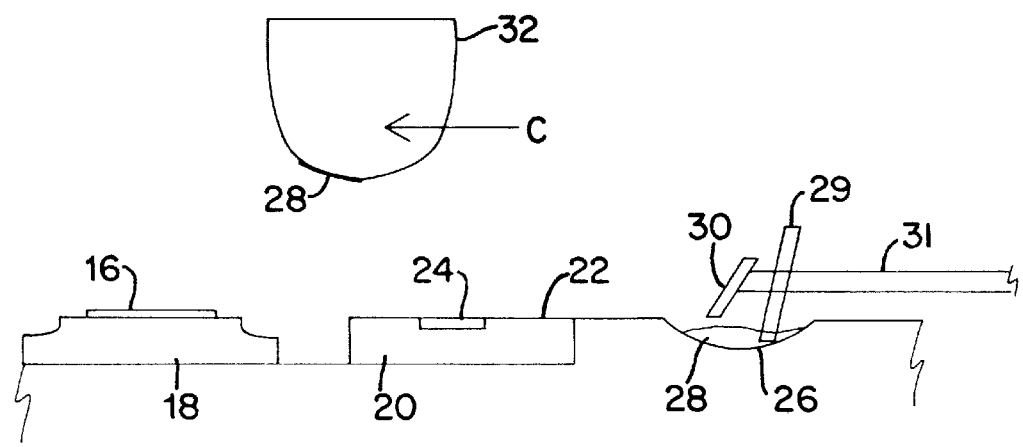
Figure 2F:
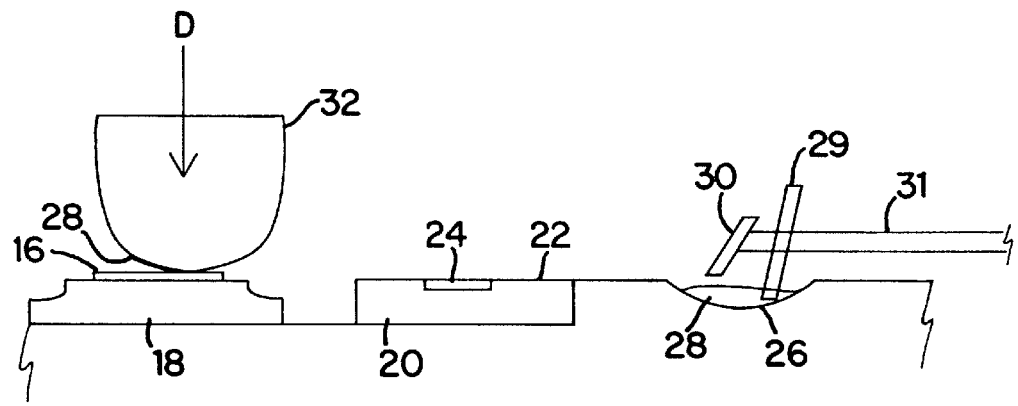
Figure 2G:
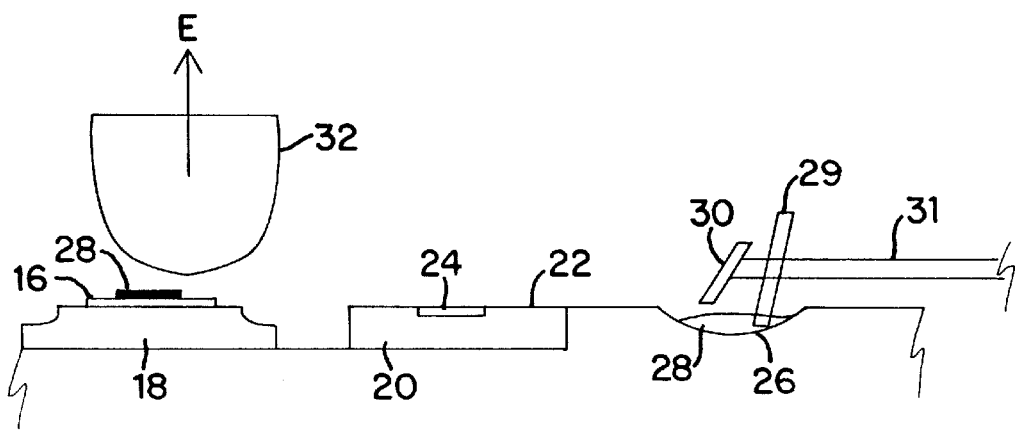

A preferred die attach method is illustrated schematically in FIGS. 2–2g.

Referring to FIG. 2, a lead frame 16 is mounted on a fixturing jig 18, to hold the lead frame in a desired position during printing of the die attach material. Adjacent the fixturing jig 18 is a template 20. Template 20 includes a flat top surface 22 and a recess 24. Recess 24 is formed, preferably by etching, to have the same dimensions as the die attach paddle of lead frame 16. A reservoir 26 is positioned on the opposite side of template 20 from the fixturing jig 18. Reservoir 26 contains a supply of die attach adhesive 28. A compressible pad 32, mounted to be moved both vertically and horizontally, is provided to transfer adhesive from reservoir 26 to a lead frame in the fixturing jig 18. The compressible pad 32 is elongated (extending into the plane of the figures), and the template includes a plurality of recesses 24 arranged in a row (also extending into the plane of the figures), so that the compressible pad can print a number of areas of adhesive onto the lead frame simultaneously.

As shown in FIG. 2a, die attach adhesive 28 is transferred from the reservoir 26 to the recess 24 of template 20 by a squeegee 29 during the forward stroke of the squeegee arm 31 (see FIG. 2a, Arrow A). Next, the squeegee 29 retracts to a raised position, and, during the backward stroke of the squeegee arm 31 (FIG. 2b, Arrow B), the level of adhesive in the recess 24 is flattened off to the level of the surface of the template by a doctor blade 30. Compressible pad 32 is positioned above the recess during this step.

In the next step, shown in FIG. 2c, the compressible pad 32 descends (arrow A) and compresses into the recess 24. This compression causes the die attach adhesive 28 in the recess 24 to adhere to the compressible pad 32. The compressible pad 32 is then raised (arrow B), as shown in FIG. 2d.

To transfer the die attach adhesive 28 to the lead frame, the compressible pad 32 is moved transversely (arrow C, FIG. 2e), and the pad 32 is lowered and compressed against lead frame 16 (arrow D, FIG. 2f).

Finally, the compressible pad 32 is raised, leaving behind a square of die attach adhesive 28 having precisely controlled dimensions and thickness (FIG. 2g).

Preferably, the die attach adhesive 28 is a B-stageable material. Use of such an adhesive will allow the adhesive to be pre-applied and B-staged at one location, and the die attached and the adhesive cured at a different location. A suitable silver filled epoxy based adhesive is Silver Filled Epoxy Polymer System 118-06, commercially available from Creative Materials, Inc., 141 Middlesex Road, Tyngsboro, Mass. 01879. This adhesive has a viscosity of from about 10,000–12,000 cps, contains less than 25% volatiles by weight, and includes Naptha 100, cyclohexanone, butyl acetate and 1-methoxy-2-propanolacetate solvents. This adhesive can be B-staged by printing the adhesive on the lead frame feature and then heating until non-tacky but not cured, for example 1–2 minutes at 125° C.

The compressible pad is preferably made of an elastomer, e.g., silicone rubber. The shape of the pad is preferably rotationally symmetrical about its vertical axis, and the pad has a curved contact surface, as shown, to provide good release during printing. The properties of the elastomer, and the radius of curvature of the compressible pad, can be readily determined experimentally for a particular application.

The pressure at which the compressible pad 32 is compressed against lead frame 16 will depend on the bondline thickness desired for the particular application. Suitable pressures can be readily determined experimentally. Depending upon the desired thickness of the adhesive layer deposited on the lead frame, the steps shown in FIGS. 2–2e and described above can be performed once per lead frame paddle, or can be repeated several times per lead frame paddle (to obtain a greater adhesive thickness).

The compressible pad is moved between the various positions shown in FIGS. 2–2e by a transfer arm (not shown) which may be operated by a motor or in any desired manner.

Pad printing equipment (the compressible pad, template, reservoir and doctor blade) is commercially available, e.g., from Tecaprint, 10 Cook Street, Billerica, Mass.

Other embodiments are within the claims.

What is claimed is:

1. A method of applying a die attach adhesive to a lead frame feature comprising:

providing a supply of die attach adhesive;

applying a portion of the die attach adhesive to a transfer member designed to move vertically and horizontally; and contacting the lead frame feature with the transfer member to print a layer of adhesive onto the lead frame feature.

2. The method of claim 1 wherein the supply of adhesive is provided in a reservoir.

3. The method of claim 2 wherein the portion of die attach adhesive is applied to the transfer member by pressing the transfer member against the surface of a template, the template having a recess in its surface that contains a selectable quantity of die attach adhesive.

4. The method of claim 3 further comprising transferring die attach adhesive from the reservoir to the recess in the template.

5. The method of claim 1 wherein said transfer member is a compressible pad.

6. The method of claim 5 wherein the compressible pad is compressed during the contacting step.

7. The method of claim 3 wherein the recess has selectable dimensions that are substantially equal to the dimensions of the lead frame feature.

8. The method of claim 1 wherein the lead frame feature is a lead frame paddle.

9. The method of claim 1 wherein the die attach adhesive is B-stageable.

10. The method of claim 9 further comprising B-staging the die attach adhesive after the contacting step.

11. The method of claim 1 further comprising repeating steps (b) and (c) until a desired adhesive thickness is obtained on the lead frame paddle.

12. The method of claim 5 wherein the compressible pad has a curved contact surface.

* * * * *